United States Patent [19]
Yamazaki

[11] Patent Number: 5,468,653
[45] Date of Patent: * Nov. 21, 1995

[54] PHOTOELECTRIC CONVERSION DEVICE AND METHOD OF MAKING THE SAME

[75] Inventor: Shunpei Yamazaki, Tokyo, Japan

[73] Assignee: Semiconductor Energy Laboratory Co., Ltd., Kanagawa, Japan

[*] Notice: The portion of the term of this patent subsequent to Dec. 31, 2008, has been disclaimed.

[21] Appl. No.: 165,536

[22] Filed: Dec. 13, 1993

Related U.S. Application Data

[60] Continuation of Ser. No. 748,421, Aug. 22, 1991, which is a division of Ser. No. 443,015, Nov. 29, 1989, Pat. No. 5,077,223, which is a continuation of Ser. No. 785,586, Oct. 8, 1985, which is a division of Ser. No. 564,213, Dec. 22, 1983, Pat. No. 4,581,476, which is a continuation-in-part of Ser. No. 525,459, Aug. 22, 1983, Pat. No. 4,591,892.

[30] Foreign Application Priority Data

Dec. 23, 1982 [JP] Japan .................. 57-228158

[51] Int. Cl.$^6$ .............................. H01L 21/20
[52] U.S. Cl. .............................. 437/4; 437/110
[58] Field of Search .................. 437/4, 88, 101, 437/110, 154; 136/258

[56] References Cited

U.S. PATENT DOCUMENTS

| | | | |
|---|---|---|---|
| 3,892,606 | 7/1975 | Chappelow et al. | 148/174 |
| 4,581,476 | 4/1986 | Yamazaki | 136/258 |
| 5,077,223 | 12/1991 | Yamazaki | 437/4 |

FOREIGN PATENT DOCUMENTS 57-187972 11/1982 Japan .

OTHER PUBLICATIONS

Ohnishi et al., The Annual Meeting of Applied Physics in Japan (1980) 3 p-T-12.
Sakai et al., The 28th Annual Meeting of Japan Soc. of Appl. Phys. (Spring 1981) 29p-T-2.
Ishiwata et al., The 28th Annual Meeting of Japan Soc. of Appl. Phys. (Spring 1981) 1a-5-9.
Moller et al., "Low Level Boron Doping and Light Induced Effects in Amorphous Silicon PIN Solar Cells", Conference Record 16th IEEE Photovoltaic Specialists Conf. San Diego, Calif., Sep. 27–30, 1982, Published Jan. 1983.
Amorphous Semiconductor, Technologies and Devices, 1982 Y. Hamakawa editor, pp. 194 and 198, North Holland Publishing Company.
Magee, "Investigations of the Hydrogen and Impurity Contents of Amorphous Silicon by Secondary Ion Mass Spectrometry", Solar Cells, 2 (1980) 365–376.

Primary Examiner—R. Bruce Breneman
Assistant Examiner—Linda J. Fleck
Attorney, Agent, or Firm—Sixbey, Friedman, Leedom & Ferguson, Jr.; Gerald J. Ferguson, Jr.; David S. Safran

[57] ABSTRACT

A photoelectric conversion device has a non-single-crystal semiconductor laminate member formed on a substrate having a conductive surface, and a conductive layer formed on the non-single-crystal semiconductor laminate member. The non-single-crystal semiconductor laminate member has such a structure that a first non-single-crystal semiconductor layer having a P or N first conductivity type, an I-type second non-single-crystal semiconductor layer and a third non-single-crystal semiconductor layer having a second conductivity type opposite the first conductivity type are laminated in this order. The first (or third) non-single-crystal semiconductor layer is disposed on the side on which light is incident, and is P-type. The I-type non-single-crystal semiconductor layer has introduced thereto a P-type impurity, such as boron which is distributed so that its concentration decreases towards the third (or first) non-single-crystal semiconductor layer in the thickwise direction of the I-type layer.

19 Claims, 5 Drawing Sheets

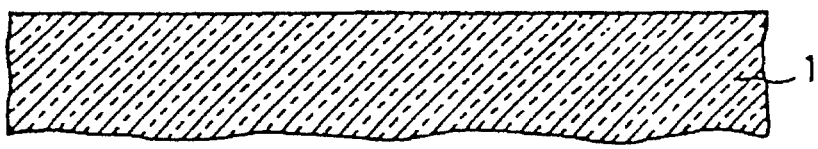
FIG. IA
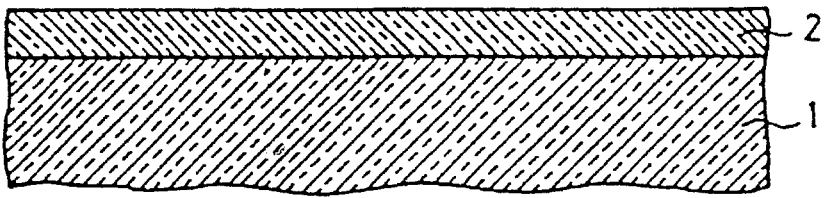
FIG. IB
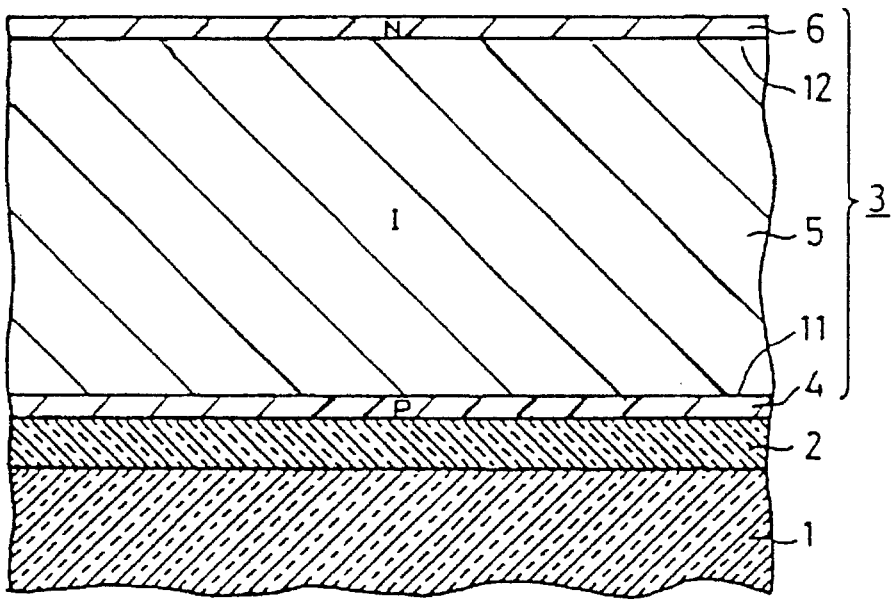
FIG. IC
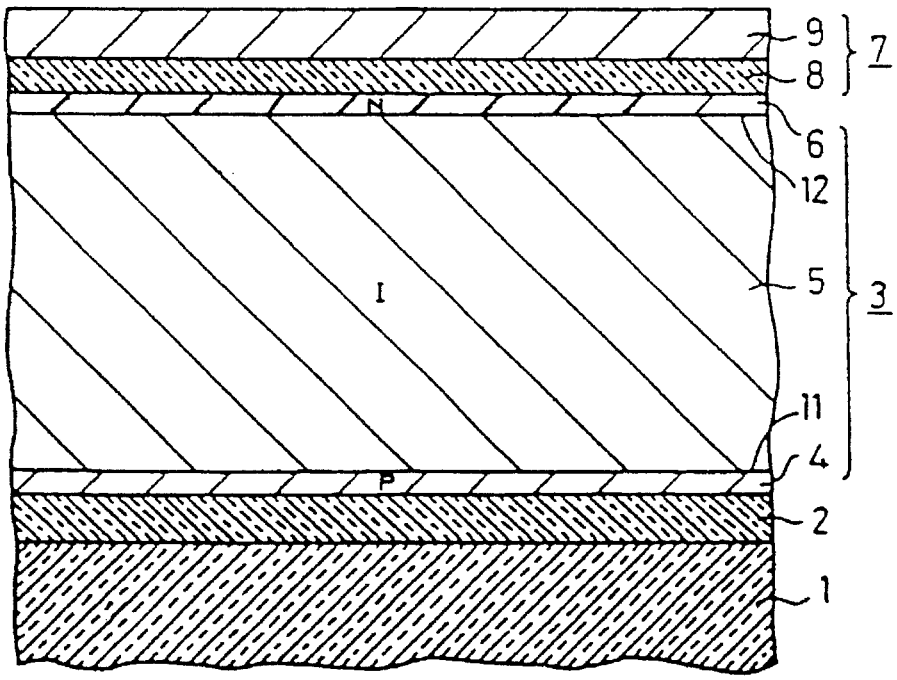
FIG. ID

PHOTOELECTRIC CONVERSION DEVICE AND METHOD OF MAKING THE SAME

This is a continuation of Ser. No. 07/748,421, filed Aug. 22, 1991; which itself was a divisional of Ser. No. 07/443, 015, filed Nov. 29, 1989, now U.S. Pat. No. 5,077,223; which was a continuation of Ser. No. 06/785,586, filed Oct. 8, 1985; which was a divisional of Ser. No. 06/564,213, filed Dec. 22, 1983, now U.S. Pat. No. 4,581,476, which in turn, was a continuation-in-part of Ser. No. 525,459 filed Aug. 22, 1983, now U.S. Pat. No. 4,591,892.

BACKGROUND OF THE INVENTION

1. Field of the Invention

The present invention relates to a photoelectric conversion device which has a non-single-crystal semiconductor laminate member having formed therein at least one PIN junction, and a method for the manufacture of such a photoelectric conversion device.

2. Description of the Prior Art

A photoelectric conversion device of the type including a non-single-crystal semiconductor laminate member having formed therein at least one PIN junction usually has a non-single-crystal semiconductor laminate member formed on a substrate having a conductive surface and a conductive layer formed on the non-single-crystal semiconductor laminate member. The non-single-crystal semiconductor laminate member has at least a first non-single-crystal semiconductor layer of a P or N first conductivity type, an I type second non-single-crystal semiconductor layer formed on the first non-single-crystal semiconductor layer and a third non-single-crystal semiconductor layer formed on the second non-single-crystal semiconductor layer and having a second conductivity type opposite from the first conductivity type. The first, second and third non-single-crystal semiconductor layers form one PIN junction.

In this case, for example, the substrate has such a structure that a light-transparent conductive layer is formed as a first conductive layer on a light-transparent insulating substrate body. The first and third non-single-crystal semiconductor layers of the non-single-crystal semiconductor laminate member are P- and N-type, respectively. Further, the conductive layer on the non-single-crystal semiconductor laminate member is formed as a second conductive layer on the N-type third non-single-crystal semiconductor layer.

With the photoelectric conversion device of such a structure as described above, when light is incident on the side of the light-transparent substrate towards the non-single-crystal semiconductor laminate member, electron-hole pairs are created by the light in the I-type second non-single-crystal semiconductor layer. Holes of the electron-hole pairs thus created pass through the P-type first non-single-crystal semiconductor layer to reach the first conductive layer, and electrons flow through the N-type third non-single-crystal semiconductor layer into the second conductive layer. Therefore, photocurrent is supplied to a load which is connected between the first and second conductive layers, thus providing a photoelectric conversion function.

In conventional photoelectric conversion devices of the type described above, however, since the I-type second non-single-crystal semiconductor layer is formed to inevitably contain oxygen with a concentration above $10^{20}$ atoms/cm$^3$, or/and carbon with a concentration above $10^{20}$ atoms/cm$^3$, or/and phosphorus with a concentration as high as above $5\times10^{17}$ atoms/cm$^3$, the I-type non-single-crystal semiconductor layer inevitably contains the impurities imparting the N conductivity type, with far lower concentrations than in the P-type first non-single-crystal semiconductor layer and the N-type third non-single-crystal semiconductor layer.

In addition, the impurity concentration has such a distribution that it undergoes substantially no variations in the thickwise direction of the layer.

On account of this, in a case where the second non-single-crystal semiconductor layer is formed thick with a view to creating therein a large quantity of electron-hole pairs in response to the incidence of light, a depletion layer, which spreads into the second non-single-crystal semiconductor layer from the PI junction defined between the P-type first and the I-type second non-single-crystal semiconductor layers, and a depletion lager, which spreads into the second non-single-crystal semiconductor layer from the NI junction defined between the N-type third and the I-type second non-single-crystal semiconductor layers, are not linked together. In consequence, the second non-single-crystal semiconductor layer has, over a relatively wide range thickwise thereof at the central region in that direction, a region in which the bottom of the conduction band and the top of the valence band of its energy and are not inclined in the directions in which to drift the holes and electrons towards the first and third non-single-crystal semiconductor layers, respectively. Therefore, the holes and electrons of the electron-hole pairs created by the incident light in the second non-single-crystal semiconductor lager, in particular, the electrons and holes generated in the central region of the second layer in its thickwise direction, are not effectively directed to the first and third non-single-crystal semiconductor layers, respectively.

Accordingly, the prior art photoelectric conversion devices of the above-described structure have the defect that even if the second non-single-crystal semiconductor layer is formed thick for creating a large quantity of electron-hole pairs in response to incident light, a high photoelectric conversion efficiency cannot be obtained.

Further, even if the I-type second non-single-crystal semiconductor layer is thick enough to permit that the depletion layer extending into the second non-single-crystal semiconductor layer from the PI junction between the P-type first non-single-crystal semiconductor layer on the side on which light is incident and the I-type second non-single-crystal semiconductor layer formed on the first semiconductor layer and the depletion layer extending into the second non-single-crystal semiconductor layer from the NI junction between the N-type third non-single-crystal semiconductor layer on the side opposite from the side of the incidence of light and the I-type second non-single-crystal semiconductor layer are linked together, the expansion of the former depletion layer diminishes with the lapse of time for light irradiation by virtue of a known light irradiation effect commonly referred to as the Staebler-Wronsky effect, because the I-type non-single-crystal semiconductor layer forming the PI junction contains the impurities which impart the N conductivity type as mentioned previously. Finally, the abovesaid depletion layers are disconnected from each other. In consequence, there is formed in the central region of the second non-single-crystal semiconductor layer in the thickwise direction thereof a region in which the bottom of the conduction band and the top of the valence band of the energy band are not inclined in the directions in which the holes and electrons of the electron-hole pairs created by the incidence of light are drifted towards the first and third non-single-crystal semiconductor layers, respectively.

Accordingly, the conventional photoelectric conversion devices of the abovesaid construction have the defect that the photoelectric conversion efficiency is impaired by the long-term use of the devices.

SUMMARY OF THE INVENTION

It is therefore an object of the present invention to provide a novel photoelectric conversion device which is able to achieve a far higher photoelectric conversion efficiency than that obtainable with the conventional devices described above.

Another object of the present invention is to provide a novel photoelectric conversion device the photoelectric conversion efficiency of which is hardly or only slightly lowered by the Staebler-Wronsky effect even if it is used for a long period of time.

Yet another object of the present invention is to provide a novel method which permits easy manufacture of the photoelectric conversion device having the abovesaid excellent features.

In accordance with an aspect of the present invention, the first (or third) non-single-crystal semiconductor layer of the non-single-crystal laminate member is a layer on the side on which light is incident and has the P conductivity type, and the I-type second non-single-crystal semiconductor layer has introduced therein an impurity for imparting thereto the P conductivity type, which is distributed so that the impurity concentration continuously lowers towards the third (or first) non-single-crystal semiconductor layer in the thickwise direction of the I-type layer.

In this case, for example, the substrate is light-transparent and, accordingly, the first non-single-crystal semiconductor layer is disposed on the side where light is incident. The first and third non-single-crystal semiconductor layers are P- and N-type, respectively, and the I-type second non-single-crystal semiconductor layer has introduced therein an impurity for imparting thereto the P-type conductivity, such as boron, so that its concentration in the region adjacent the first non-single-crystal semiconductor layer is higher than the concentration in the region adjacent the third non-single-crystal semiconductor layer.

On account of this, even if the I-type second non-single-crystal semiconductor layer is formed relatively thick for creating therein a large quantity of electron-hole pairs in response to the incidence of light, there are joined together the depletion layer extending into the second the second non-single-crystal semiconductor layer from the PI junction between the first and second non-single-crystal semiconductor layers and the depletion layer extending into the second non-single-crystal layer from the NI junction between the third and second non-single-crystal semiconductor layers. Accordingly, the holes and electrons which are produced in the central region of the second non-single-crystal semicondutor layer in its thickwise direction are also effectively drifted towards the first and third non-single-crystal semiconductor layers, respectively.

Moreover, even if the I-type second non-single-crystal semiconductor layer contains impurities which imparts thereto the N-type conductivity, because it is formed to inevitably contain oxygen and/or carbon and phosphorus in large quantities as described previously, boron which imparts the P-type conductivity, introduced in the second non-single-crystal semiconductor layer, combines with oxygen, or/and carbon, or/and phosphorus. Besides, the P-type impurity introduced in the second non-single-crystal semiconductor layer has a high concentration in the region thereof adjacent the P-type first non-single-crystal semiconductor layer, that is, on the side of the PI junction. Therefore, the expansion of the depletion layer spreading into the second non-single-crystal semiconductor layer from the PI junction between the first and second non-single-crystal semiconductor layers is scarcely or only slightly diminished by the light irradiation effect (the Staeabler-Wronsky effect).

Accordingly, the photoelectric conversion device of the present invention retains a high photoelectric conversion efficiency, even if used for a long period of time.

In accordance with another aspect of the present invention, the second non-single-crystal semiconductor layer, which has introduced thereinto an impurity, which imparts the P-type conductivity, with such a distribution that its concentration continuously lowers towards the N-type third (or first) non-single-crystal semiconductor layer in the thickwise direction of the second layer, can easily be formed, through a CVD (Chemical Vapor Deposition) method using a semiconductor material gas and an impurity material gas for imparting the P-type conductivity, only by continuously decreasing (or increasing) the concentration of the raw impurity material gas relative to the semiconductor material gas with the lapse of time.

Accordingly, the manufacturing method of the present invention allows ease in the fabrication of the photoelectric conversion device of the present invention which possesses the aforementioned advantages.

Other objects, features and advantages of the present invention will become more fully apparent from the detailed description taken in conjunction with the accompanying drawings.

BRIEF DESCRIPTION OF THE DRAWINGS

FIGS. 1A to D are sectional views schematically illustrating a sequence of steps involved in the manufacture of a photoelectric conversion device in accordance with an embodiment of the present invention;

DESCRIPTION OF THE PREFERRED EMBODIMENTS

Figure 2A:
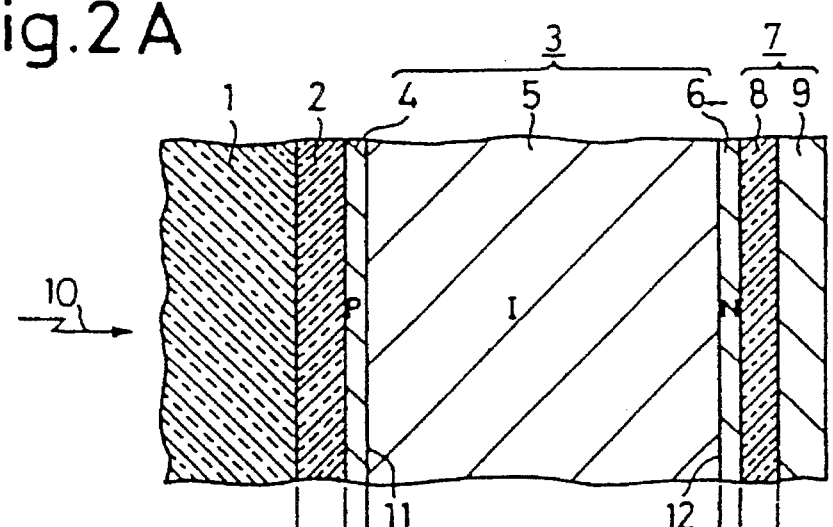
FIG. 2A is a sectional view schematically illustrating a first embodiment of the photoelectric conversion device by the manufacturing method shown in FIG. 1.

A description will be given of, with reference to FIGS. 1 and 2, of a first embodiment of the photoelectric conversion device of the present invention, along with the manufacturing method of the present invention.

The manufacture of the photoelectric conversion device starts with the preparation of an insulating, light-transparent substrate 1 as of glass (FIG. 1).

A light-transparent conductive layer 2 is formed on the substrate 1 (FIG. 1B).

The conductive layer 2 is formed of, for example, a tin oxide, or a light-transparent conductive material consisting principally of a tin oxide. The conductive layer 2 is formed by, for example, a known vacuum evaporation method to a thickness of, for instance, 0.1 to 0.2 µm.

Next, a non-single-crystal semiconductor laminate member 3 is formed on the conductive layer 2 (FIG. 1C).

The non-single-crystal semiconductor laminate member 3 has such a structure that a P-type non-single-crystal semiconductor layer 4, an I-type non-single-crystal semiconductor layer 5 and an N-type non-single-crystal semiconductor layer 6 are sequentially formed in this order. These non-single-crystal semiconductor layers 4, 5 and 6 form an PIN junction.

The non-single-crystal semiconductor layer 4 of the non-single-crystal semiconductor laminate member 3 is formed of, for example, Si, $Si_xC_{1-x}$ (where $0<x<1$, for instance, $x=0.8$) or Ge in an amorphous, semi-amorphous or microcrystalline form. The non-single-crystal semiconductor layer 4 is, for example, 100 angstroms tihck.

The non-single-crystal semiconductor layer 4 is formed by a CVD method which employs a semiconductor material gas composed of a hydride or halide of a semiconductor, such as Si, $Si_{x-1}$, or Ge, and an impurity material gas composed of a hydride or halide of a P-type impurity, for instance, diborane ($B_2H_6$), such as a CVD method employing or not employing a glow discharge (plasma), or a CVD method employing light. In this case, the non-single-crystal semiconductor layer 4 has introduced therein the P-type impurity (boron) in a concentration as high as $1\times10^{19}$ to $6\times10^{20}$ atoms/cm$^3$, as shown in FIG. 2B.

The non-single-crystal semiconductor layer 5 is formed of, for instance, amorphous or semi-amorphous silicon, and has a thickness of, for example, 3 to 0.8 µm, in particular, 0.5 µm.

The non-single-crystal semiconductor layer 5 is formed by a CVD method which uses a semiconductor material gas composed of a hydride or halide of silicon, for example, $Si_nH_{2n+2}$ (where n is greater than or equal to 1), or $SiF_m$ (where m is greater than or equal to 2), and an impurity material gas composed of a hydride or halide of a P-type impurity, for instance, diborane ($B_2H_6$), such as a CVD method employing or not employing a glow discharge (plasma), or a CVD method employing light. In this case, by decreasing the concentration of the impurity material gas relative to the concentration of the semiconductor material gas within a range less than 5 ppm with the lapse of time, the non-single-crystal semiconductor layer 5 is formed to have introduced thereinto the P-type impurity (boron) the concentration of which linearly and continuously lowers in the thickwise direction of the layer towards the non-single-crystal semiconductor layer 4 as shown in FIG. 2B. The concentration of the P-type impurity in the non-single-crystal semiconductor layer 5 is high on the side of the non-single-crystal semiconductor layer 4 as compare with the impurity concentration on the side of the non-single-crystal semiconductor layer 6. The ratio of the impurity concentration in the layer 5 at one end thereof adjacent the layer 6 to the concentration at the other end adjacent the layer 4 is 1/10 to 1/100, preferably, 1/20 to 1/40. In practice, the P-type impurity (boron) has a concentration of $2\times10^{15}$ to $2\times10^{17}$ atoms/cm$^3$ at the end of the layer 5 adjacent the layer 4 and a concentration below $1\times10^{15}$ atoms/cm$^3$ at the end of the layer 5 adjacent the layer 6.

The non-single-crystal semiconductor layer 5 is formed by the abovesaid CVD method. In this case, the semiconductor material gas is one that is obtained by passing a raw semiconductor material gas through a molecular sieve or zeolite which adsorbs oxygen, or/and carbon or/and phosphorus. Accordingly, the non-single-crystal semiconductor layer 5 is formed to contain oxygen with a concentration as low as $5\times10^{18}$ atoms/cm$^3$, or/and carbon with a concentration as low as $4\times10^{15}$ atoms/cm$^3$, or/and phosphorus with a concentration as low as $5\times10^{15}$ atoms/cm$^3$.

The non-single-crystal semiconductor layer 6 formed of, for instance, microcrystalline silicon, and has a thickness of, for example, 100 to 300 angstroms.

The non-single-crystal semiconductor layer 6 is formed by a CVD method which employs a semiconductor material gas composed of a hydride or halide of silicon, for example, $Si_nH_{2n+2}$ (where n is greater than or equal to 1) or $SiF_m$ (where m is greater than or equal to 2), and an impurity material gas composed of a hydride or halide of an N-type impurity, for instance, phosphine ($PH_3$), such as a CVD method employing or not employing a glow discharge (plasma), or a CVD method employing light. In this case, the non-single-crystal semiconductor layer 6 has introduced thereinto the N-type impurity (phosphorus) with a concentration of $1\times10^{19}$ to $6\times10^{20}$ atoms/cm$^3$, as shown in FIG. 2.

Next, a conductive layer 7 is formed on the non-single-crystal semiconductor laminate member 3 made up of the non-single-crystal semiconductor layers 4, 5 and 6, that is, on the non-single-crystal semiconductor layer 6 (FIG. 1D).

The conductive layer 7 has such a structure that a light-transparent conductive layer 8 formed of, for example, a tin oxide or a light-transparent conductive material consisting principally of the tin oxide, and a reflective conductive layer 9 formed of a metal, such as aluminum, silver or the like, are formed in this order. In this case, the conductive layer 8 is formed 900 to 1300 angstroms by means of, for example, vacuum evaporation, and the conductive layer 9 is also formed by the vacuum evaporation.

Figure 2B:
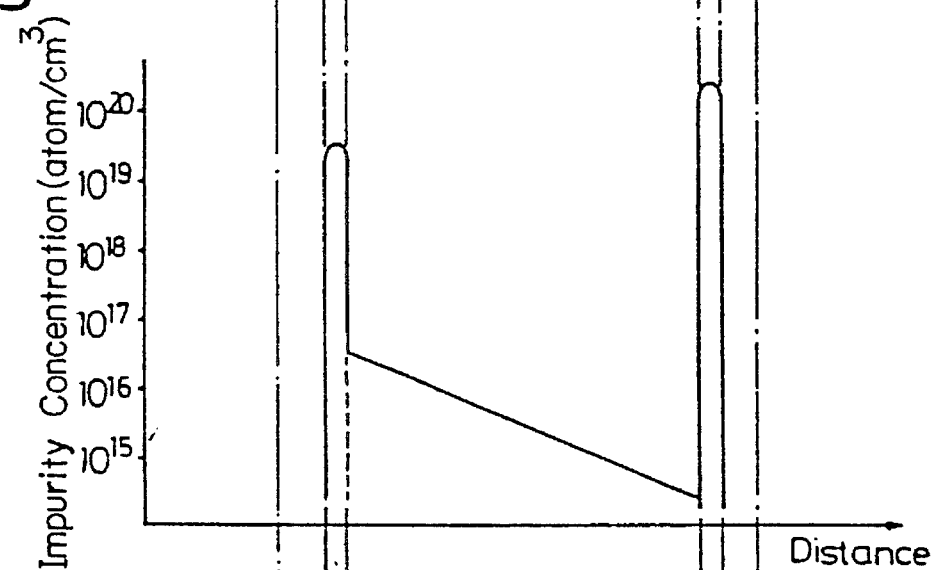
FIG. 2B is a graph showing the concentration distributions of impurities introduced into first, second and third non-single-crystal semiconductor layers of the photoelectric conversion device depicted in FIG. 2A.

In the manner described above, the first embodiment of the photoelectric conversion device of the present invention shown in FIG. 2A is manufactured.

With the photoelectric conversion device shown in FIG. 2A, when light 10 is incident on the side of the substrate 1 towards the non-single-crystal semiconductor laminate member 3, electron-hole pairs are created in the I-type non-single-crystal semiconductor layer 5 in response to the light 10. The holes of the electron-hole pairs thus produced flow through the P-type non-single-crystal semiconductor layer 4 into the light-transparent conductive layer 2, and the electrons flow through the N-type non-single-crystal semiconductor layer 6 into the conductive layer 7. Therefore, photocurrent is supplied to a load which is connected between the conductive layers 2 and 7, thus providing the photoelectric conversion function.

In this case, the I-type non-single-crystal semiconductor layer 5 has introduced thereinto the P-type impurity (boron) which is distributed so that the impurity concentration continuously decreases towards the non-single-crystal semiconductor layer 6 in the thickwise direction of the layer 5, as shown in FIG. 2B. On account of this, even if the I-type non-single-crystal semiconductor layer 5 is formed thick for generating therein a large quantity of electraon-hole pairs in response to the incident of light, a depletion layer (not shown) which extends into the non-single-crystal semiconductor layer 5 from a PI junction 11 between the P-type non-single-crystal semiconductor layer 4 and the I-type non-single-crystal semiconductor layer 5 and a depletion (not shown) layer which extends into the non-single-crystal semiconductor layer 5 from an NI junction 12 between the N-type non-single-crystal semiconductor layer 6 and the non-single-crystal semiconductor layer 5 are joined together. Therefore, the I-type non-single-crystal semiconductor layer 5, as viewed from the bottom of the conduction band and the top of the valence bands of its energy band, has such a gradient that effectively drifts holes and electrons towards the non-single-crystal semiconductor layers 4 and 6, respectively.

Accordingly, the photoelectric conversion device of the present invention, shown in FIG. 2A, achieves a higher photoelectric conversion efficiency than do the conventional photoelectric conversion devices.

Figure 3:
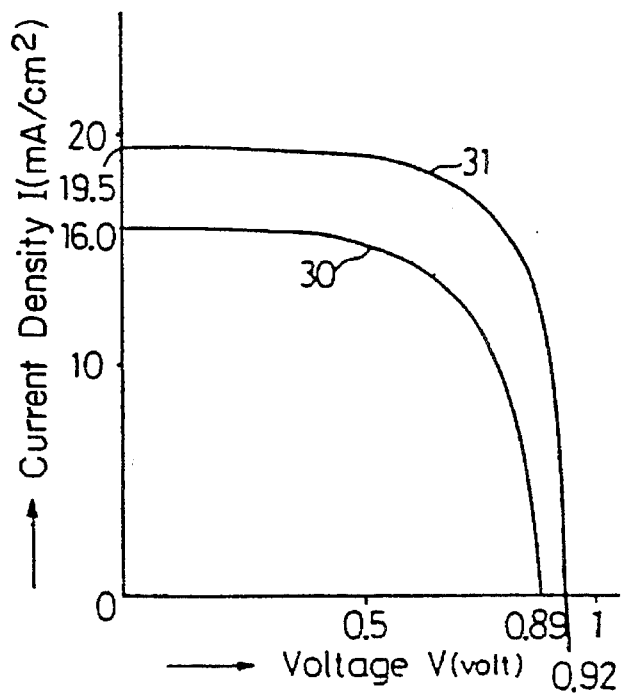
FIG. 3 is a graph showing the voltage V (volt)-current density I ($mA/cm^2$) characteristic of the photoelectric conversion device of FIG. 2, in comparison with such a characteristic of a conventional photoelectric conversion device.

By the way, according to a photoelectric conversion device corresponding to the conventional one that is identical in construction with the photoelectric conversion device of the present invention shown in FIG. 2A, except that the concentration of the N-type impurity in the I-type non-single-crystal semiconductor layer 5 is about $10^{16}$ atoms/cm$^3$ which is far lower than the impurity concentrations in the P-type and I-type non-single-crystal semiconductor layers 4 and 6 because the I-type non-single-crystal semiconductor layer 5 is formed to inevitably contain oxygen, or/and carbon, or/and phosphorus in large quantities, as referred to previously, such a voltage V (volt)-current density I (mA/cm$^2$) characteristic as indicated by a curve 30 in FIG. 3 was obtained. Accordingly, an open-circuit voltage was 0.89 V, a short-circuiting current density I 16.0 mA/cm$^2$, a file factor 61% and the photoelectric conversion efficiency about 8.7%. In contrast thereto, according to the photoelectric conversion device of the present invention shown in FIG. 2A, such a voltage V -current density I characteristic as indicated by a curve 31 in FIG. 3 was obtained. Accordingly, the open-circuit voltage V was 0.92 V which is higher than was obtained with the abovesaid device corresponding to the prior art device; the current density I was 19.5 mA/cm$^2$; the file factor was 68%; and the photoelectric conversion efficiency was about 12.2%. Incidentally, these results were obtained under the condition that the photoelectric conversion devices, each having the non-single-crystal semiconductor laminate member 3 of a 1.05 cm$^2$ area, were exposed to irradiation by light with an intensity AM1 (100 mW/cm$^2$).

In the case of the photoelectric conversion device of the present invention shown in FIG. 2A, since the I-type non-single-crystal semiconductor layer 5 has introduced thereinto the boron as the P-type impurity the boron combines with the oxygen or/and carbon or/and phosphorus inevitably contained in the non-single-crystal semiconductor layer 5. In addition, the concentration of the P-type impurity (boron) is high on the side of the PI junction 11, that is, on the side of the P-type non-single-crystal semiconductor layer 4. Accordingly, the expansion of the depletion layer extending into the I-type non-single-crystal semiconductor layer 5 from the PI junction 11 between the P-type non-single-crystal semiconductor layer 4 and the I-type non-single-crystal semiconductor layer 5 is hardly or only slightly diminished by the light irradiation effect (the Staebler-Wronsky effect).

For this reason, according to the photoelectric conversion device of the present invention, the aforesaid high photoelectric conversion efficiency is hardly impaired by the long-term use.

Figure 4:
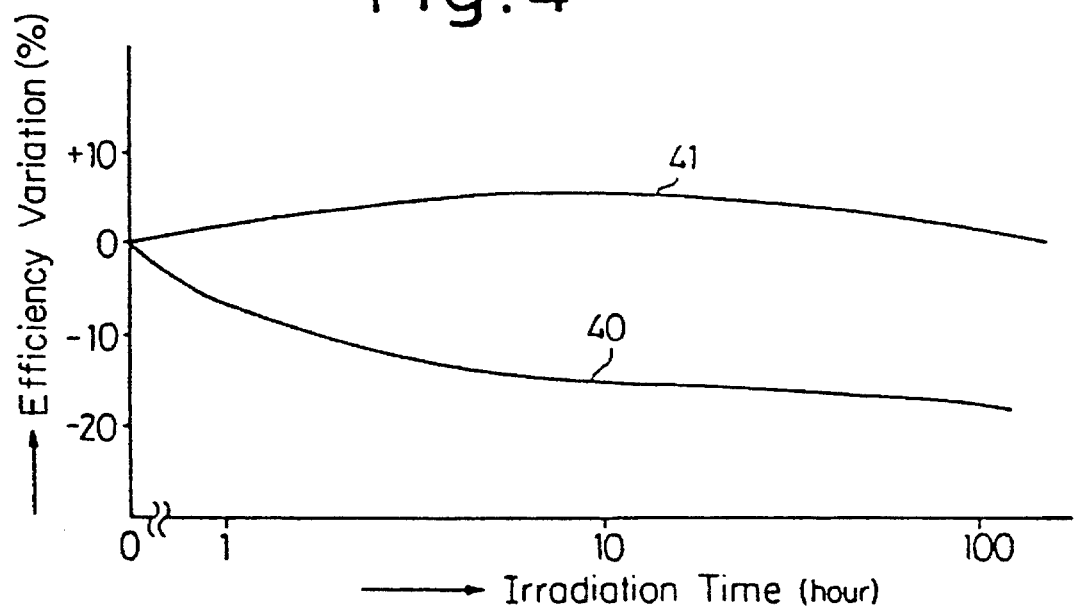
FIG. 4 is a graph showing variations (%) in the photoelectric conversion efficiency of the photoelectric conversion device of the present invention, shown in FIG. 2, in comparison with a conventional photoelectric conversion device.

By the way, according to the aforesaid photoelectric conversion device corresponding to the prior art one which provided the voltage V-current density I characteristic indicated by the curve 30 in FIG. 3, variations (%) in the photoelectric conversion efficiency relative to the light irradiation time T (hr) was as indicated by a curve 40 in FIG. 4. In contrast thereto, in the case of the photoelectric conversion device of the present invention, the photoelectric conversion efficiency varied with the light irradiation time T as indicated by a curve 41 in FIG. 4. That is, the photoelectric conversion efficiency slightly increased in an early stage and, thereafter, it decreased only very slightly with time. These result were also obtained under the same condition mentioned previously in connection with FIG. 3.

As described above, the first embodiment of the photoelectric conversion device of the present invention possesses the advantage that it provides a higher photoelectric conversion efficiency than do the conventional photoelectric conversion devices, even if used for a long period of time.

Further, the manufacturing method of the present invention shown in FIG. 1 employs a series of such simple steps of forming the conductive layer 2 on the substrate 1, forming the non-single-crystal semiconductor layers 4, 5 and 6 on the conductive layer 2 through the CVD method to provide the non-single-crystal semiconductor laminate member 3 and forming the conductor layer 7 on the non-single-crystal semiconductor laminate member 3. The I-type non-single-crystal semiconductor layer 5 is formed by the CVD method using a semiconductor material gas and a P-type impurity (boron) gas and, in this case, only by continuously changing the concentration of the impurity material gas relative to the concentration of the semiconductor material gas with the lapse of time, the P-type impurity is introduced into the layer 5 with such a concentration distribution that its concentration continuously decreases towards the non-single-crystal semiconductor layer 6 in the thickwise direction of the layer 5.

Accordingly, the manufacturing method of the present invention allows ease in the fabrication of the photoelectric conversion device of the present invention which has the aforementioned advantages.

Figure 2C:
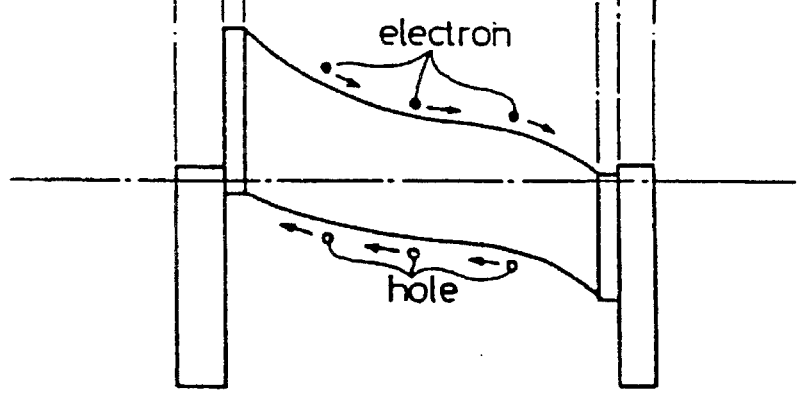
FIG. 2C is a graph showing the energy band of the photoelectric conversion device shown in FIG. 2A.

Incidentally, the first embodiment illustrated in FIG. 2 shows the case in which the impurity contained in the I-type non-single-crystal semiconductor layer 5 has such a concentration distribution as shown in FIG. 2B in which the concentration linearly and continuously drops towards the non-single-crystal semiconductor layer 6.

Figure 5A:
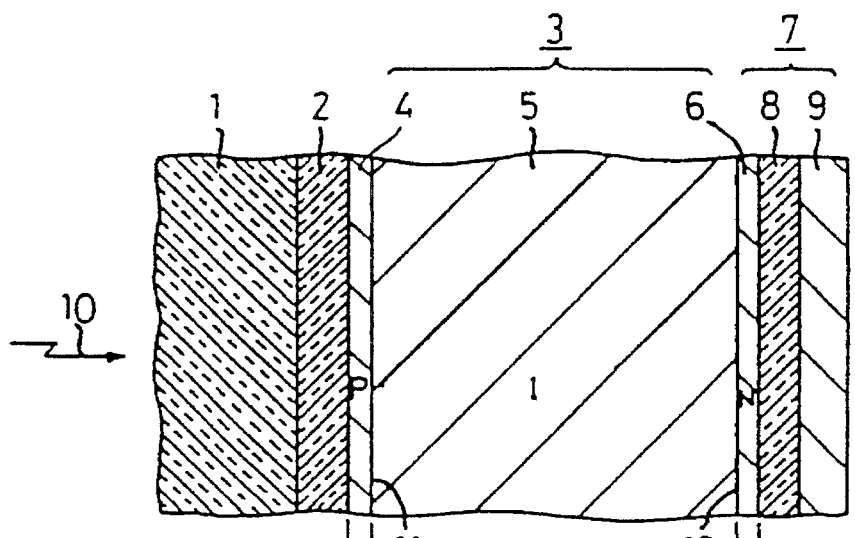
FIG. 5A is a sectional view schematically illustrating a second embodiment of the photoelectric conversion device of the present invention.
Figure 5B:
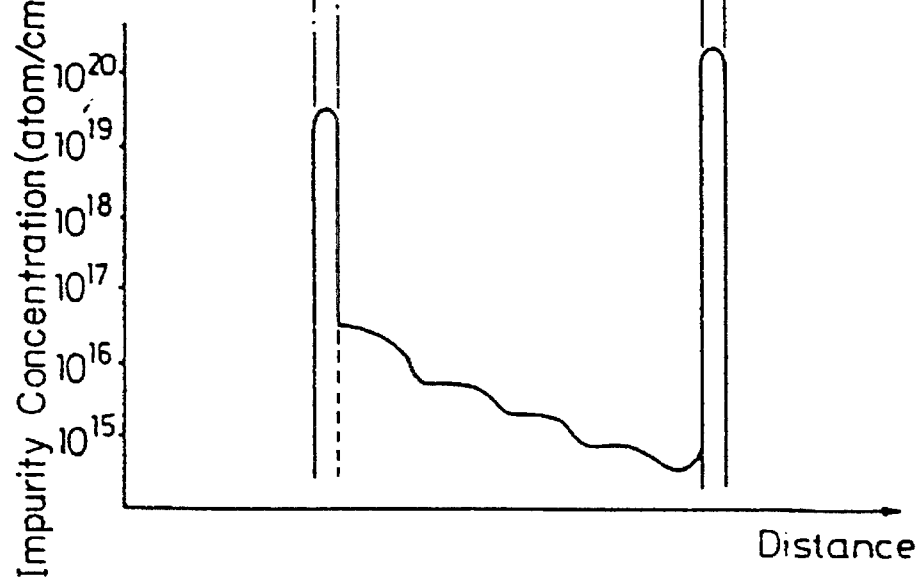
FIG. 5B is a graph showing concentration distributions of impurities introduced into first, second and third non-single-crystal semiconductor layers of the second embodiment of the present invention.
Figure 6A:
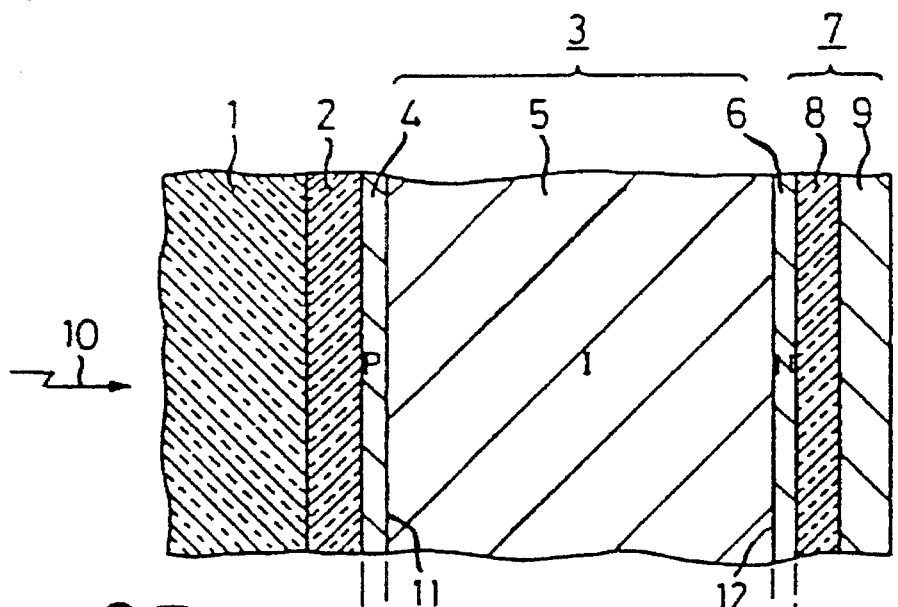
FIG. 6A is a sectional view schematically illustrating a third embodiment of the photoelectric conversion device of the present invention.
Figure 6B:
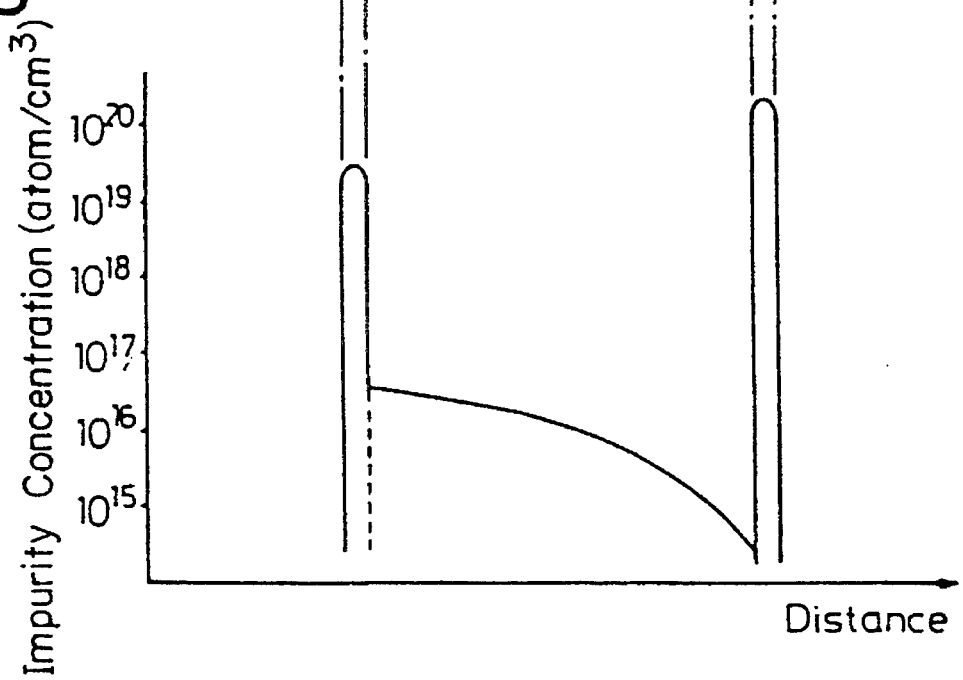
FIG. 6B is a graph showing the concentration distributions of impurities introduced into first, second and third non-single-crystal semiconductor layers of the photoelectric conversion device shown in FIG. 6A.

As will be appreciated from the above, however, even if the impurity introduced in the I-type non-single-crystal semiconductor layer 5 has such a concentration that the impurity concentration drops stepwise and continuously towards the non-single-crystal semiconductor layer 6 as shown in FIG. 5 which illustrates a second embodiment of the present invention, and even if the impurity in the layer 5 has such a concentration distribution that the impurity concentration lowers non-linearly and continuously towards the layer 6 in a manner to obtain such a concentration distribution that the impurity concentration abruptly drops in the end portion of the layer 5 adjacent the layer 6 as shown in FIG. 6 which illustates a third embodiment of the present invention, the photoelectric conversion device of the present invention produces the same excellent operation and effects as are obtainable with the photoelectric conversion device shown in FIG. 2.

Further, the foregoing description has been given of the case where light is incident on the photoelectric conversion device from the side of the substrate 1 and, accordingly, the non-single-crystal semiconductor layer 4 of the non-single-crystal semiconductor laminate member 3 on the side on which the light is incident is P-type.

But, also in a case where the photoelectric conversion device is arranged to be exposed to light on the side opposite from the substrate 1, the non-single-crystal semiconductor layer 6 of the non-single-crystal semiconductor laminate member 3 on the side of the incidence of light is P-type, the non-single-crystal semiconductor layer 4 on the side of the substrate 1 is N-type and the non-single-crystal semiconductor layer 5 has introduced thereinto a P-type impurity (boron) which is distributed so that the impurity concentration continuously decreases towards the non-single-crystal semiconductor layer 4 in the thickwise direction of the layer 5, the same excellent operation and effects as described previously can be obtained, as will be understood from the foregoing description. In this case, however, the conductive layer 7 must be substituted with a light-transparent one. The substrate 1 and the conductive layer 2 need not be light-transparent.

While in the foregoing the non-single-crystal semiconductor laminate member 3 has one PIN junction, it is also possible to make the laminate member 3 have two or more PIN junctions and to form each of two or more I-type non-single-crystal semiconductor layers so that the P-type impurity introduced therein may have the aforesaid concentration distribution.

It will be apparent that many modifications and variations may be effected without departing from the scope of the novel concepts of the present invention.

What is claimed is:

1. A manufacturing method of a photoelectric conversion device comprising the steps of:

forming a p-type non-single crystalline $Si_xC_{1-x}$ (0<x<1) layer on a substrate in a reaction chamber;

depositing a substantially intrinsic crystalline non-single silicon semiconductor layer on said p-type layer by introducing process gas into said reaction chamber together with a dopant gas comprising boron, the introducing ratio of the dopant gas to the process gas being continuously decreased throughout the deposition of the intrinsic semiconductor layer in order that the boron concentration in the intrinsic semiconductor layer is continuously decreased from the interface between the p-type and intrinsic semiconductor layers so that the ratio of the boron concentration at the interface between an n-type and intrinsic layers to that at the interface between the p-type and intrinsic layers is 1/10 to 1/100;

forming the n-type non-single microcrystalline semiconductor layer; and forming an electrode arrangement for said conversion device.

2. A method as in claim 1 where said ratio is 1/20 to 1/40.

3. A method as in claim 1 where said boron concentration at said interface between the p-type and intrinsic layers is $2\times10^{15}$ to $2\times10^{17}$ atoms/cm$^3$.

4. A method as in claim 1 wherein said electrode arrangement comprises a material selected from the group consisting of tin oxide, aluminum, and silver.

5. A manufacturing method of a photoelectric conversion device comprising the steps of:

forming a p-type non-single crystalline $Si_xC_{1-x}$ (0<x<1) layer on a substrate in a reaction chamber;

depositing a substantially intrinsic non-single crystalline silicon semiconductor layer on said p-type layer by introducing process gas into said reaction chamber together with a dopant gas comprising boron, the introduction ratio of the dopant gas to the process gas being continuously decreased throughout the deposition of the intrinsic semiconductor layer in order that the boron concentration in the intrinsic semiconductor layer is continuously decreased from the interface between the p-type and intrinsic semiconductor layers;

forming an n-type microcrystalline semiconductor layer; and forming an electrode arrangement for said conversion device.

6. A method as in claim 5 wherein said boron concentration at said interface between the p-type and intrinsic layers is $2\times10^{15}$ to $2\times10^{17}$ atoms/cm$^3$.

7. A method as in claim 5 wherein the introduction of said process gas together with said dopant gas is carried out so that said boron concentration in said intrinsic semiconductor layer is stepwise decreased from said interface between the p-type and intrinsic semiconductor layers.

8. A method as in claim 5 wherein the introduction of said process gas together with said dopant gas is carried out so that said boron concentration in said intrinsic semiconductor layer is abruptly decreased in the end portion of said intrinsic semiconductor layer adjacent to said n-type microcrystalline semiconductor layer.

9. A method as in claim 5 wherein said electrode arrangement comprises a material selected from the group consisting of tin oxide, aluminum, and silver.

10. A manufacturing method of a photoelectric conversion device comprising the steps of:

forming a p-type non-single crystalline $Si_xC_{1-x}$ (0<x<1) layer on a substrate in a reaction chamber;

depositing a substantially intrinsic non-single crystalline silicon semiconductor layer on said p-type layer by introducing process gas into said reaction chamber together with a dopant gas comprising boron, the introducing ratio of the dopant gas to the process gas being stepwise and continuously decreased throughout the deposition of the intrinsic semiconductor layer in order that the boron concentration in the intrinsic semiconductor layer is stepwise and continuously decreased from the interface between the p-type and intrinsic semiconductor layers so that the ratio of the boron concentration at the interface between an n-type and intrinsic layers to that at the interface between the p-type and intrinsic layers is 1/10 to 1/100 forming the n-type non-single crystalline semiconductor layer; and forming an electrode arrangement for said conversion device.

11. A manufacturing method of a photoelectric conversion device comprising the steps of:

forming a p-type non-single crystalline $Si_xC_{1-x}$ ($0<x<1$) layer on a substrate in a reaction chamber;

depositing a substantially intrinsic non-single crystalline silicon semiconductor layer on said p-type layer by introducing process gas into said reaction chamber together with a dopant gas comprising boron, the introducing ratio of the dopant gas to the process gas being linearly decreased throughout the deposition of the intrinsic semiconductor layer such that the boron concentration in the intrinsic semiconductor layer is linearly decreased from the interface between the p-type and intrinsic semiconductor layers so that the ratio of the boron concentration at the interface between an n-type and intrinsic layers to that at the interface between the p-type and intrinsic layers is 1/10 to 1/100, and the boron concentration in said intrinsic semiconductor layer is abruptly decreased in the end portion of said intrinsic semiconductor layer adjacent to the n-type non-single crystalline semiconductor layer;

forming the n-type non-single crystalline semiconductor layer; and forming an electrode arrangement for said conversion device.

12. A manufacturing method of manufacturing a photoelectric conversion device comprising the steps of:

forming a p-type non-single crystalline semiconductor layer in a reaction chamber;

depositing a substantially intrinsic non-single crystalline silicon semiconductor layer on said p-type layer by introducing process gas into said reaction chamber together with a p-type impurity dopant gas comprising a p-type dopant;

forming an n-type non-single crystalline semiconductor layer on said intrinsic semiconductor layer;

wherein the introduction ratio of the dopant gas to the process gas is linearly decreased throughout the deposition of the intrinsic semiconductor layer in order that the concentration of the p-type dopant in the intrinsic semiconductor layer is linearly decreased from the interface between the p-type and intrinsic semiconductor layers to the interface between the n-type and intrinsic semiconductor layers.

13. The method of claim 12 wherein said p-type dopant is boron.

14. The method of claim 12 wherein said p-type semiconductor layer is formed on a first electrode.

15. The method of claim 14 wherein a second electrode is further formed on said n-type non-single crystalline semiconductor layer.

16. The method of claim 12 wherein said intrinsic semiconductor layer is formed by plasma CVD.

17. A method of manufacturing a photoelectric conversion device comprising the steps of:

forming an n-type non-single crystalline semiconductor layer in a reaction chamber;

depositing a substantially intrinsic non-single crystalline silicon semiconductor layer on said n-type layer by introducing process gas into said reaction chamber together with a p-type impurity dopant gas comprising a p-type dopant;

forming a p-type non-single crystalline semiconductor layer on said intrinsic semiconductor layer;

wherein the introduction ratio of the dopant gas to the process gas is linearly decreased throughout the deposition of the intrinsic semiconductor layer in order that the concentration of the p-type dopant in the intrinsic semiconductor layer is linearly decreased from the interface between the p-type and intrinsic semiconductor layers to the interface between the n-type and intrinsic semiconductor layers.

18. The method of claim 17 wherein said p-type dopant is boron.

19. The method of claim 17 wherein said intrinsic semiconductor layer is formed by plasma CVD.

* * * * *